(12) United States Patent
He et al.

(10) Patent No.: US 11,094,752 B2
(45) Date of Patent: Aug. 17, 2021

(54) DISPLAY PANEL AND PREPARATION METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventors: Kunpeng He, Guangdong (CN); Jia Tang, Guangdong (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 16/612,399

(22) PCT Filed: Aug. 29, 2019

(86) PCT No.: PCT/CN2019/103158
§ 371 (c)(1),
(2) Date: Nov. 11, 2019

(87) PCT Pub. No.: WO2020/237875
PCT Pub. Date: Dec. 3, 2020

(65) Prior Publication Data
US 2020/0373358 A1  Nov. 26, 2020

(51) Int. Cl.
*H01L 27/32* (2006.01)
*H01L 51/00* (2006.01)
(Continued)

(52) U.S. Cl.
CPC ........ *H01L 27/322* (2013.01); *H01L 27/3246* (2013.01); *H01L 51/001* (2013.01);
(Continued)

(58) Field of Classification Search
CPC ..................................................... H01L 27/322
See application file for complete search history.

(56) References Cited

U.S. PATENT DOCUMENTS

| 2013/0153870 A1 | 6/2013 | Seo et al. |
| 2013/0175512 A1 | 7/2013 | Kim et al. |
| (Continued) | | |

FOREIGN PATENT DOCUMENTS

| CN | 103165650 A | 6/2013 |
| CN | 103178084 A | 6/2013 |
| CN | 105932038 A | 9/2016 |

*Primary Examiner* — Yu-Hsi D Sun
(74) *Attorney, Agent, or Firm* — Mark M. Friedman

(57) ABSTRACT

A display panel and a preparation method thereof, the display panel includes a substrate layer, a passivation layer, a plurality of color resisting units, a plurality of anodes, a pixel definition layer, a light emitting layer and a cathode. The present disclosure through makes at least one of the color resisting units partially cover a projection of the light emitting layer on the color resisting units to overcome the problem that part of the light emitted from the light emitting layer passing through the color resistance unit for adjusting a color gamut, and the brightness of part of the unadjusted light will not lost, thus, at last, the display panel has lack of display brightness due to adjusting the color gamut of the display and using the color resistance unit.

10 Claims, 2 Drawing Sheets

(51) Int. Cl.
*H01L 51/52* (2006.01)
*H01L 51/56* (2006.01)

(52) U.S. Cl.
CPC ...... *H01L 51/0005* (2013.01); *H01L 51/0018* (2013.01); *H01L 51/5206* (2013.01); *H01L 51/5221* (2013.01); *H01L 51/56* (2013.01); *H01L 2227/323* (2013.01); *H01L 2251/301* (2013.01); *H01L 2251/308* (2013.01)

(56) References Cited

U.S. PATENT DOCUMENTS

| | | | | |
|---|---|---|---|---|
| 2016/0049426 | A1* | 2/2016 | Lim | H01L 51/5284 257/72 |
| 2017/0338290 | A1 | 11/2017 | Liu et al. | |
| 2018/0009775 | A1* | 1/2018 | Tanaka | G03F 7/0046 |

* cited by examiner

DISPLAY PANEL AND PREPARATION METHOD THEREOF

FIELD OF INVENTION

The present disclosure relates to a display technology field, and specifically relates to a display panel and preparation method thereof.

BACKGROUND OF INVENTION

An organic light emitting diode (OLED) is also known as an organic electroluminesence display device or an organic light emitting semiconductor. Basic structure of an OLED is indium tin oxide (ITO) which is thin and transparent and has characteristics of a semiconductor connected to a positive electrode, and added other metal surface cathode, than packaging into a sandwich-like structure. The entire structural layer includes a hole transport layer (HTL), a light emitting layer (EL) and an electron transport layer (ETL). When the power is supplied to an appropriate voltage, the positive holes and the surface cathode charges are combined in the light emitting layer, and under Coulomb force, excitons (electron-hole pairs) in an excited state are combined at a certain probability, and the excited state is unstable in a general environment. The excitons in the excited state recombine and transfer energy to a luminescent material, causing it to jump from the ground state to the excited state, and the energy in excited state generates photons through the radiation relaxation process to release light energy and produce light, and according to the different formula of the luminescent material, it can produce three primary colors of red, green and blue (RGB colors) to form the basic colors.

First, an OLED has self-illuminating characteristics, unlike a thin film transistor liquid crystal display (TFT-LCD), which requires a backlight, so visibility and brightness of an OLED are high. Second, OLEDs have advantages such as low voltage demand, high power saving efficiency, quick response, light weight, thin thickness, simple structure, low cost, wide visual angle, almost infinite contrast, low power consumption and high reaction speed, and have become one of the most important display technologies today, and gradually replacing the TFT-LCDs and expected to become the next generation mainstream display technology after LCD.

With development of OLED technology, it is now broadly divided into two major categories: an evaporation OLED and a printed OLED. When manufacturing an OLED device that emits red (R) light, green (G) light and blue (B) light (RGB light), due to material and process limitations, the OLED emission spectra usually is different from that required by customers. At this time, usually adding a color film of a color filter on array (COA) structure to filter the light emitted by the OLED to achieve the purpose of adjusting the color gamut for the display. However, the light of the OLED device tends to lose more brightness after passing through the color filter, to a certain extent, which will affect the display quality of the display, increase the power consumption of the OLED device, and accelerate the aging of the device. Therefore, it is necessary to seek a new type of a display panel to solve the problems mentioned above.

SUMMARY OF INVENTION

The purpose of the present disclosure is to provide a display panel and a preparation method thereof, which can solve the existing problems such as losing a light brightness in the existing display panel due to the color filter, thereby causing large power consumption of an OLED device and aging of the device in fast speed.

In order to solve problems mentioned above, one embodiment of the present disclosure provides a display panel, which includes: a substrate layer, a passivation layer, a plurality of color resisting units, a plurality of anodes, a pixel definition layer, a light emitting layer and a cathode. The passivation layer is disposed on the substrate layer; the color resisting units are spaced apart on the passivation layer; the planarization layer is disposed on the color resisting units; the anodes are disposed on the planarization layer and correspond to the color resisting units; the pixel definition layer is disposed on the planarization layer between the adjacent anodes; the light emitting layer is disposed on the anodes; the cathode is disposed on the light emitting layer; at least one of the color resisting units partially covers a projection of the light emitting layer on the color resisting units.

Further, a constituent material of the passivation layer is $SiO_2$.

Further, a constituent material of the planarization layer and the pixel definition layer is organic photoresist material.

Further, a constituent material of the pixel definition layer is organic photoresist material.

Further, a constituent material of the anodes includes one or more of indium tin oxide, and indium zinc oxide.

Further, a constituent material of the cathode includes one or more of aluminum, silver, and copper.

Another embodiment of the present disclosure further provides a preparation method for the display panel that the present disclosure relates to, which includes:

Step S1, providing a substrate layer.

Step S2, preparing a passivation layer on the substrate layer.

Step S3, preparing a plurality of color resisting units spaced apart on the passivation layer.

Step S4, preparing a planarization layer on the color resisting units.

Step S5, corresponding to the color resisting units and preparing a plurality of anodes on the planarization layer.

Step S6, preparing a pixel definition layer on the planarization layer between the adjacent anodes.

Step S7, preparing a light emitting layer on the anodes.

Step S8, preparing a cathode on the light emitting layer.

At least one of the color resisting units partially covers a projection of the light emitting layer on the color resisting units.

Further, the planarization layer in the step S4 is prepared by a photo process.

Further, the pixel definition layer in the step S6 is prepared by a photo process.

Further, a preparation method for the light emitting layer in the step S7 includes one of an evaporation method and an ink printing method.

The present disclosure relates to a display panel and a preparation method thereof. The present disclosure through makes at least one of the color resisting units partially covers a projection of the light emitting layer on the color resisting units to overcome the problem that part of the light emitted from the light emitting layer passing through the color resistance unit for adjusting a color gamut, and the brightness of part of the unadjusted light will not lost, thus, at last, the display panel has lack of display brightness due to adjusting the color gamut of the display and using the color resistance unit.

DESCRIPTION OF DRAWINGS

To more clearly illustrate the technical solutions of the embodiments of the present disclosure, the accompanying figures of the present disclosure will be described in brief. Obviously, the accompanying figures described below are only part of the embodiments of the present disclosure, from which figures those skilled in the art can derive further figures without making any inventive efforts.

DETAILED DESCRIPTION OF PREFERRED EMBODIMENTS

The preferred embodiments of the present disclosure are described in detail below with reference to the accompanying figures to completely introduce technical content of the present disclosure to those skilled in the art, and to give an example that the present disclosure can be implemented. This makes the technical content of the present disclosure will be clearer and those skilled in the art will more readily understand how to implement the present disclosure. However, the present disclosure can be implemented in many different forms of embodiments. The scope of the present disclosure is not limited to the embodiments mentioned herein, and the description of the embodiments below is not intended to limit the scope of the present disclosure.

The directional terms of which the present disclosure mentions, for example, "top," "bottom," "upper," "lower," "front," "rear," "left," "right," "inside," "outside," "side," etc., are just refer to directions of the accompanying figures. The directional terms used herein are used to explain and describe the present disclosure, and are not intended to limit the scope of the present disclosure.

In the accompanying figures, elements with same structures are used same labels to indicate, and components that have similar structure or function are denoted by similar labels. Moreover, for ease of understanding and description, the dimensions and thickness of each component shown in the accompanying figures are arbitrarily shown, and the present disclosure does not limit the dimensions and thickness of each component.

When a component is described as "on" another component, the component can be placed directly on the other component; there can also be an intermediate component, the component is placed on the intermediate component, and the intermediate component is placed on another component. When a component is described as "mounted" or "connected to" another component, it can be understood as "directly mounted" or "directly connected to", or a component is "mounted" or "connected to" through an intermediate component to another component.

The First Embodiment

Figure 1:
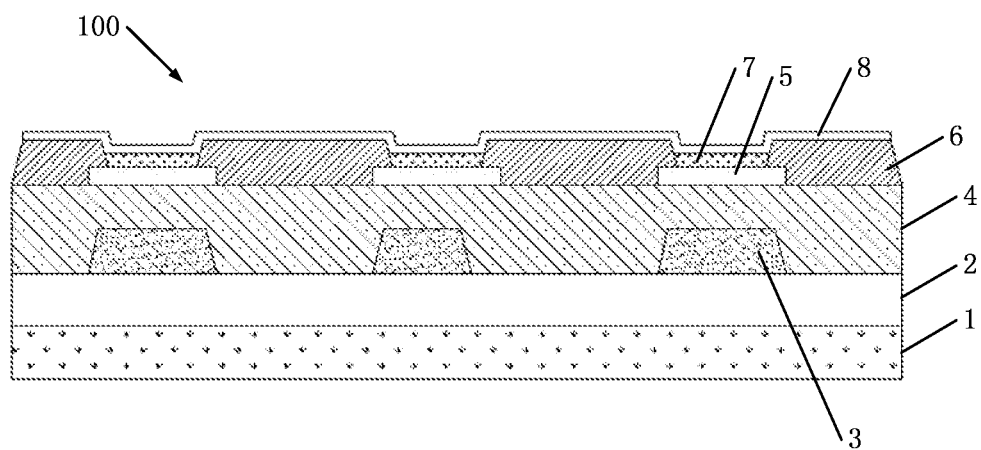
FIG. 1 is a structural schematic diagram of the display panel of the present disclosure.

As illustrated in FIG. 1, a display panel 100 includes a substrate layer 1, a passivation layer 2, a plurality of color resisting units 3, a planarization layer 4, a plurality of anodes 5, a pixel definition layer 6, a light emitting 7 and a cathode 8. The passivation layer 2 is disposed on the substrate layer 1; the color resisting units 3 are spaced apart on the passivation layer 2; the planarization layer 4 is disposed on the color resisting units 3; the anodes 5 are disposed on the planarization layer 4 and correspond to the color resisting unit 3; the pixel definition layer 6 is disposed on the planarization layer 4 between the adjacent anodes 5; the light emitting layer 7 is disposed on the anodes 5; the cathode 8 is disposed on the light emitting layer 7; the light emitting layer 7 is directly above the color resisting units 3, and at least one of the color resisting units 3 partially covers a projection of the light emitting layer 7 on the color resisting unit 3. With this to overcome the problem that part of the light emitted from the light emitting layer 7 passing through the color resistance units 3 for adjusting a color gamut, and the brightness of part of the unadjusted light will not lost, thus, at last, the display panel 100 has lack of display brightness due to adjusting the color gamut of the display and using the color resistance unit.

Specifically, a constituent material of the passivation layer is $SiO_2$. The passivation layer 2 prepared by $SiO_2$ is more flexible and can improve bending performance of the display panel 100.

Specifically, a constituent material of the planarization layer 4 and the pixel definition layer 6 is organic photoresist material.

Further, a constituent material of the anodes includes one or more of indium tin oxide, and indium zinc oxide. The anodes 5 prepared by one or more of indium tin oxide, and indium zinc oxide has good light transmission performance, and can improve the luminous efficacy of the display panel 100.

Further, a constituent material of the cathode 8 includes one or more of aluminum, silver, and copper. The cathode 8 prepared by one or more of aluminum, silver, and copper has good reflection performance, and can well emit light emitted from the light emitting layer 7 to the anodes 5 and then to be emitted out from the anodes 5, thereby improving the luminous efficacy of the display panel 100.

Figure 2:
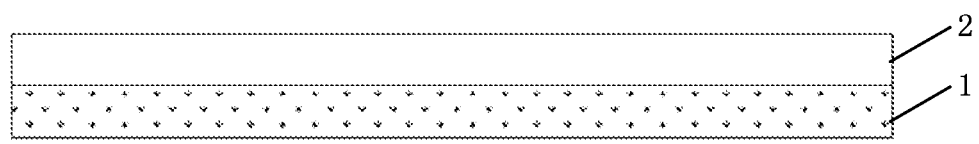
FIG. 2 is a first preparation structure schematic diagram of the display panel of the present disclosure.

As illustrated in FIG. 2, another embodiment of the present disclosure further provides a preparation method for the display panel 100 that the present disclosure relates to, which includes: step S1, providing a substrate layer 1; step S2, preparing a passivation layer 2 on the substrate layer 1.

Figure 3:
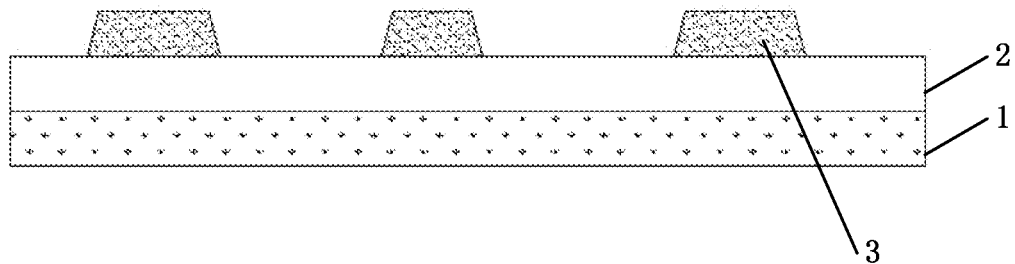
FIG. 3 is a second preparation structure schematic diagram of the display panel of the present disclosure.

As illustrated in FIG. 3, the preparation method for the display panel 100 further includes: step S3, preparing a plurality of color resisting units spaced apart on the passivation layer.

Figure 4:
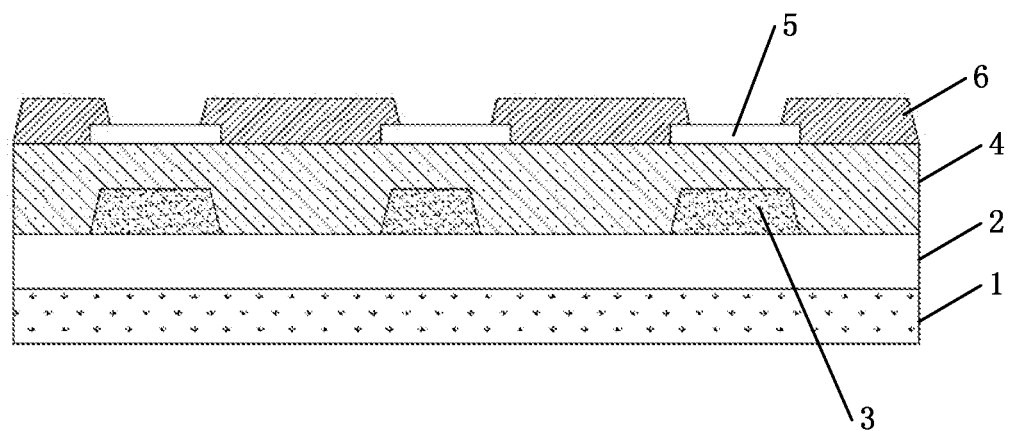
FIG. 4 is a third preparation structure schematic diagram of the display panel of the present disclosure.

As illustrated in FIG. 4, the preparation method for the display panel 100 further includes: step S4, preparing a planarization layer 4 on the color resisting units 3; and step S5, corresponding to the color resisting unit 3 and preparing a plurality of anodes 5 on the planarization layer 4; and at least one of the color resisting units 3 partially covers a projection of the light emitting layer 7 on the color resisting units 3; step S6, preparing a pixel definition layer on the planarization layer between the adjacent anodes 5.

Further, the preparation method for the display panel 100 further includes: step S7, preparing a light emitting layer 7 on the anodes 5; and step S8, preparing a cathode 8 on the light emitting layer 7 to form the display panel 100 as illustrated in FIG. 1.

Further, the planarization layer 4 in the step S4 and the pixel definition layer 6 in the step S6 can be prepared by a photo process.

Further, a preparation method for the light emitting layer 7 in the step S7 includes one of an evaporation method and an ink printing method.

In summary, in the display panel 100 prepared through the method mentioned above, can overcome the problem that part of the light emitted from the light emitting layer 7 passing through the color resistance units 3 for adjusting a color gamut, and the brightness of part of the unadjusted light will not lost, thus, at last, the display panel 100 has lack of display brightness due to adjusting the color gamut of the display and using the color resistance unit.

The display panel and the preparation method thereof provided by the present disclosure are described in detail above. It should be understood, that the exemplary embodiments described herein should be considered in descriptive, and is used for understanding the method of the present disclosure and its main idea, and is not intended to limit the present disclosure. Descriptions of features or aspects in each exemplary embodiment should generally be considered as being applied to similar features or aspects in other exemplary embodiments. While the present disclosure has been described with reference to the preferred embodiments, various modifications and changes can be made by those skilled in the art. The present disclosure is intended to cover such varieties and modifications within the scope of the appended claims, and any modifications, equivalents, and improvements made within the spirit and scope of the present disclosure should be included in the scope of the present disclosure.

What is claimed is:

1. A display panel, comprising:
   a substrate layer;
   a passivation layer disposed on the substrate layer;
   a plurality of color resisting units spaced apart on the passivation layer;
   a planarization layer disposed on the color resisting units; and
   a plurality of anodes disposed on the planarization layer and corresponding to the color resisting units;
   a pixel definition layer disposed on the planarization layer between the adjacent anodes;
   a plurality of light emitting layers disposed on the anodes and spaced apart; and
   a cathode disposed on the light emitting layer;
   wherein the each of the anodes is directly above each of the color resisting units, and at least one of the color resisting units partially covers a projection of the light emitting layer on the color resisting units, and
   wherein the light emitting layers emit a light, a first part of the light passes through the color resisting units and the anodes, the color resisting units adjust a color gamut of the first part of the light and reduce a brightness of the first part of the light, and a second part of the light different from first part of the light passes through gaps between the color resisting units.

2. The display panel as claimed in claim 1, wherein a constituent material of the passivation layer is SiO2.

3. The display panel as claimed in claim 1, wherein a constituent material of the planarization layer is organic photoresist material.

4. The display panel as claimed in claim 1, wherein a constituent material of the pixel definition layer is organic photoresist material.

5. The display panel as claimed in claim 1, wherein a constituent material of the anodes comprises one or more of indium tin oxide, and indium zinc oxide.

6. The display panel as claimed in claim 1, wherein a constituent material of the cathode comprises one or more of aluminum, silver, and copper.

7. A preparation method for the display panel as claimed in claim 1, comprising:
   step S1, providing a substrate layer;
   step S2, preparing a passivation layer on the substrate layer;
   step S3, preparing a plurality of color resisting units spaced apart on the passivation layer;
   step S4, preparing a planarization layer on the color resisting units; and
   step S5, corresponding to the color resisting unit and preparing a plurality of anodes on the planarization layer;
   step S6, preparing a pixel definition layer on the planarization layer between the adjacent anodes;
   step S7, preparing a plurality of light emitting layers spaced apart on the anodes; and
   step S8, preparing a cathode on the light emitting layer;
   wherein each of the anodes is directly above each of the color resisting units, and at least one of the color resisting units partially covers a projection of the light emitting layer on the color resisting units, and
   wherein the light emitting layers emit a light, a first part of the light passes through the color resisting units and the anodes, the color resisting units adjust a color gamut of the first part of the light and reduce a brightness of the first part of the light, and a second part of the light different from first part of the light passes through gaps between the color resisting units.

8. The preparation method for the display panel as claimed in claim 7, wherein the planarization layer in the step S4 is prepared by a photo process.

9. The preparation method for the display panel as claimed in claim 7, wherein the pixel definition layer in the step S6 is prepared by a photo process.

10. The preparation method for the display panel as claimed in claim 7, wherein a preparation method for the light emitting layers in the step S7 comprises one of an evaporation method and an ink printing method.

* * * * *